(12) United States Patent
Kang et al.

(10) Patent No.: US 9,099,525 B2
(45) Date of Patent: Aug. 4, 2015

(54) BLANKET EPI SUPER STEEP RETROGRADE WELL FORMATION WITHOUT SI RECESS

(71) Applicants: Laegu Kang, Hopewell Junction, NY (US); Vara Govindeswara Reddy Vakada, Fishkill, NY (US); Michael P. Ganz, Fishkill, NY (US); Yi Qi, Fishkill, NY (US); Puneet Khanna, Wappinger Falls, NY (US); Sri Charan Vemula, Fishkill, NY (US); Srikanth Samavedam, Fishkill, NY (US)

(72) Inventors: Laegu Kang, Hopewell Junction, NY (US); Vara Govindeswara Reddy Vakada, Fishkill, NY (US); Michael P. Ganz, Fishkill, NY (US); Yi Qi, Fishkill, NY (US); Puneet Khanna, Wappinger Falls, NY (US); Sri Charan Vemula, Fishkill, NY (US); Srikanth Samavedam, Fishkill, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 211 days.

(21) Appl. No.: 13/729,207

(22) Filed: Dec. 28, 2012

(65) Prior Publication Data

US 2014/0183551 A1 Jul. 3, 2014

(51) Int. Cl.
*H01L 21/762* (2006.01)
*H01L 29/66* (2006.01)
*H01L 29/10* (2006.01)
*H01L 21/8238* (2006.01)
*H01L 29/165* (2006.01)

(52) U.S. Cl.
CPC .. *H01L 21/76224* (2013.01); *H01L 21/823807* (2013.01); *H01L 21/823878* (2013.01); *H01L 21/823892* (2013.01); *H01L 29/1054* (2013.01); *H01L 29/66651* (2013.01); *H01L 29/165* (2013.01)

(58) Field of Classification Search
CPC ............. H01L 21/02293; H01L 21/02694; H01L 21/20; H01L 21/2033
USPC .......................................................... 438/424
See application file for complete search history.

(56) References Cited

U.S. PATENT DOCUMENTS

| | | | | |
|---|---|---|---|---|
| 7,601,646 | B2* | 10/2009 | Kim et al. | 438/697 |
| 8,058,161 | B2* | 11/2011 | Barna et al. | 438/589 |
| 8,319,311 | B2* | 11/2012 | Chen et al. | 257/510 |
| 8,415,214 | B2* | 4/2013 | Jakubowski et al. | 438/207 |
| 8,580,133 | B2* | 11/2013 | Reimer et al. | 216/93 |
| 8,642,419 | B2* | 2/2014 | Kronholz et al. | 438/207 |
| 2008/0081404 | A1* | 4/2008 | Barna et al. | 438/197 |
| 2009/0127648 | A1* | 5/2009 | Chen et al. | 257/506 |
| 2010/0230757 | A1* | 9/2010 | Chen et al. | 257/368 |

(Continued)

OTHER PUBLICATIONS

A. Hokazono et al., Steep Channel & Halo Profiles utilizing Boron-Diffusion-Barrier Layers (Si:C) for 32 nm Node and Beyond, Symposium on VLSI Technology Digest of Techincal Papers, 2008; pp. 112-113.

(Continued)

*Primary Examiner* — Earl Taylor
(74) *Attorney, Agent, or Firm* — Ditthavong & Steiner, P.C.

(57) ABSTRACT

A method of forming SSRW FETs with controlled step height between a field oxide and epitaxially grown silicon and the resulting devices are provided. Embodiments include providing a SiN layer on a substrate, forming first, second, and third spaced STI regions of field oxide through the SiN layer and into the substrate, removing a top portion of the field oxide for each STI region by a controlled deglaze, removing the SiN layer, forming an n-type region in the substrate between the first and second STI regions and a p-type region in the substrate between the second and third STI regions, and epitaxially growing a Si based layer on the substrate over the n-type and p-type regions.

11 Claims, 5 Drawing Sheets

(56) References Cited

U.S. PATENT DOCUMENTS

| | | |
|---|---|---|
| 2012/0187450 A1* | 7/2012 | Jakubowski et al. .......... 257/192 |
| 2012/0256268 A1* | 10/2012 | Li et al. .......... 257/369 |
| 2012/0326076 A1* | 12/2012 | Arndt et al. .......... 252/79.3 |
| 2013/0122716 A1* | 5/2013 | Reimer et al. .......... 438/749 |
| 2013/0140564 A1* | 6/2013 | Lutz .......... 257/48 |
| 2013/0181263 A1* | 7/2013 | Cai et al. .......... 257/288 |
| 2013/0214381 A1* | 8/2013 | Kronholz et al. .......... 257/506 |
| 2013/0214392 A1* | 8/2013 | Kronholz et al. .......... 257/622 |
| 2013/0221478 A1* | 8/2013 | Kronholz et al. .......... 257/506 |
| 2013/0234138 A1* | 9/2013 | Lutz .......... 257/48 |
| 2014/0183551 A1* | 7/2014 | Kang et al. .......... 257/77 |

OTHER PUBLICATIONS

A. Hokozono et al., Steep Channel Profiles in n/pMOS Controlled by Boron-doped Si:C Layers for Continual Bulk-CMOS Scaling, IEDM 2009; pp. 673-676.

\* cited by examiner

BLANKET EPI SUPER STEEP RETROGRADE WELL FORMATION WITHOUT SI RECESS

TECHNICAL FIELD

The present disclosure relates to formation of super steep retrograde well (SSRW) field effect transistors (FETs). The present disclosure is particularly applicable to SSRW bulk CMOS-based devices for 22 nanometer (nm) technology nodes and beyond.

BACKGROUND

A SSRW FET design is known to enhance device performance while suppressing a short-channel effect. SSRW profile refers to a low (or no) doping concentration at the surface while maintaining a high enough concentration at sub-surface region to prevent short channel problems. FIG. 1 shows super steep retrograde channel/well, for example boron (B), depth profile 101 compared to a broad channel/well doping depth profile 103. The very low doping concentration at the surface of the SSRW improves impurity scattering (therefore increasing mobility/drive current) and static random access memory (SRAM) variability (AVT). AVT is a critical parameter for SRAM Vmin determination and yield, which is associated with process variation. AVT is known to deteriorate at high doping concentrations due to random dopant fluctuations (RDF) for very small devices such as SRAM devices. Since SSRW can provide low or no doping at the surface, AVT can be significantly improved. SSRW profile can also improve short channel issues due to the very high doping profile at sub-surface regions where punch-through can happen from the drain to the source.

Attempts to form SSRW FETs have included Vt control ion implantation and a carbon doped silicon (Si:C) epitaxial barrier layer followed by silicon epitaxial layer growth. The resulting devices demonstrated 13% ion improvement and AVT improvement. However, the blanket epitaxy was grown after the shallow trench isolation (STI) chemical mechanical polishing (CMP), followed by stripping of the active region silicon nitride (SiN). In general, the field oxide height is taller than the active region after the SiN strip for further field oxide consumption during later cleaning processes, such as a preclean for a thick gate oxide furnace process. The step height should be close to zero before polysilicon deposition for well established technologies. Without precise control of the height between the active region and the field oxide, after the epitaxial growth, the height difference between the active region and field oxide (step height) causes process/device issues at the polysilicon gate and replacement metal gate (RMG) modules. Polysilicon gate patterning is very sensitive to substrate topology, and the final gate height varies significantly between the active regions and field oxide after polysilicon CMP at the RMG module unless the step height is close to zero.

In addition, when the field oxide surface positions lower than the active surface after epitaxial growth (a negative step height), and, therefore, the active sidewall is exposed at polysilicon deposition, a very low threshold device will be formed along the sidewall from the drain to the source, which will cause device stability issues. The step height can be controlled by etching Si using a reactive ion etch (RIE) before the epitaxy, depending on the thickness of the epitaxy, to form the flat step height. However, due to the field oxide slope which is not vertical due to the nature of the active recess process, there is always undetached Si at the bottom sidewall, resulting in residual Si where there will be unfavorable 2-dimensional (2-D) epitaxial growth rather than vertical growth. The 2-D epitaxial growth will be even more troublesome when different epitaxial layers are grown as back-to-back such as Si:C followed by a Si layer. The epitaxial layers at the bottom corner may be different from the layers at the center of the active region.

A need therefore exists for methodology enabling step height control without a silicon RIE before the epitaxial process, and the resulting devices.

SUMMARY

An aspect of the present disclosure is a method of controlling a step height difference between a field oxide and epitaxially grown silicon by performing a controlled deglaze for the field oxide.

Another aspect of the present disclosure is a device including a field oxide and epitaxially grown silicon with a controlled step height difference between the field oxide and the silicon.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a SiN layer on a substrate; forming first, second, and third spaced STI regions of field oxide through the SiN layer and into the substrate; removing a top portion of the field oxide for each STI region by a controlled deglaze; removing the SiN layer; forming an n-type region in the substrate between the first and second STI regions and a p-type region in the substrate between the second and third STI regions; and epitaxially growing a silicon (Si) based layer on the substrate over the n-type and the p-type regions.

Aspects of the present disclosure include providing a sacrificial oxide layer on the substrate below the SiN layer. Other aspects include removing the sacrificial oxide layer by precleaning prior to epitaxially growing the Si based layer. Further aspects include removing 4 nm of field oxide from each STI region during precleaning. Another aspect includes performing CMP on the STI regions down to a top surface of the SiN layer prior to the controlled deglaze. An additional aspect includes removing 5 to 10 nm of field oxide by the controlled deglaze. Other aspects include the controlled deglaze including a SiCoNi etch or a hydrogen fluoride (HF) etch followed by a SiCoNi etch followed by another HF etch. Further aspects include epitaxially growing the Si based layer by: epitaxially growing Si:C on the substrate to a thickness of 5 to 10 nm; and epitaxially growing Si on the Si:C to a thickness of 10 to 15 nm.

Additional aspects include epitaxially growing the Si based layer over the p-type region by: forming a hardmask on the sacrificial oxide layer between the first and the second STI regions after forming the n-type and p-type regions; removing the sacrificial oxide layer; epitaxially growing Si:C, e.g. to a thickness of 5 to 10 nm, on the substrate over the p-type region; and epitaxially growing Si, e.g. to a thickness of 10 to 15 nm on the Si:C. Further aspects include epitaxially growing the Si based layer over the n-type region by: forming a second hardmask on the Si over the p-type region; removing the first hardmask from between the first and the second STI regions; removing the sacrificial oxide from the between the first and the second STI regions; and epitaxially growing a second Si, e.g. to a thickness of 15 to 20 nm, on the substrate over the n-type region; and removing the second hardmask. Other aspects include removing the first hardmask from between the first and the second STI regions before the second hardmask deposition and forming the second hardmask on the Si over the p-type region.

Additional aspects include epitaxially growing the Si based layer over the p-type region by: forming a hardmask on the sacrificial oxide layer between the second and third STI regions after forming the n-type and p-type regions; removing the sacrificial oxide layer; and epitaxially growing Si, e.g. to a thickness of 15 to 20 nm, on the substrate over the n-type region. Further aspects include epitaxially growing the Si based layer over the p-type region by: forming a second hardmask on the Si over the n-type region; removing the first hardmask from between the second and third STI regions; removing the sacrificial oxide from between the second and third STI regions; epitaxially growing a Si:C layer to a thickness of 5 to 10 nm on the substrate over the p-type region; epitaxially growing Si, e.g. to a thickness of 10 to 15 nm, on the Si:C; and removing the second hardmask. Other aspects include removing the first hardmask from between the second and the third STI regions before the second hardmask deposition and forming the second hardmask on the Si over the n-type region.

Additional aspects include epitaxially growing the Si based layer over the p-type region by: forming a hardmask on the sacrificial oxide layer between the first and the second STI regions after forming the n-type and p-type regions; removing the sacrificial oxide layer; epitaxially growing Si:C, e.g. to a thickness of 5 to 10 nm, on the substrate over the p-type region; epitaxially growing Si, e.g. to a thickness of 10 to 15 nm, on the Si:C. Further aspects include epitaxially growing a Si epitaxial layer over the n-type and p-type regions by: removing a first hardmask from between the first and the second STI regions; removing the sacrificial oxide from between the first and the second STI regions; and epitaxially growing Si, e.g. to a thickness of 10 to 15 nm on both n-type and p-type regions.

Another aspect of the present disclosure is a device including: a substrate; first, second, and third STI regions of field oxide formed in the substrate and extending 21 nm above the substrate; a n-type region in the substrate between the first and second STI regions and an p-type region in the substrate between the second and third STI regions; and an epitaxially grown Si based layer having a thickness of 15 to 20 nm on the substrate over the p-type region and the n-type region.

Aspects include the epitaxially grown Si based layer including epitaxially grown Si:C having a thickness of 5 to 10 nm on the substrate and epitaxially grown Si having a thickness of 10 to 15 nm on the epitaxial grown Si:C. Another aspect includes the Si:C having a 0.5 to 2% carbon atomic concentration. Further aspects include the epitaxially grown Si based layer including: epitaxially grown Si:C having a thickness of 5 to 10 nm over the p-type region and a first epitaxially grown Si having a thickness of 10 to 15 nm over the epitaxially grown Si:C; and a second epitaxially grown Si having a thickness of 15 to 20 nm over the n-type region. Other aspects include the p-type region being doped with boron (B) and the n-type region being doped with phosphorus (P) or arsenic (As). Additional aspects include a height of the STI regions above the substrate being formed by a controlled deglaze of the field oxide.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
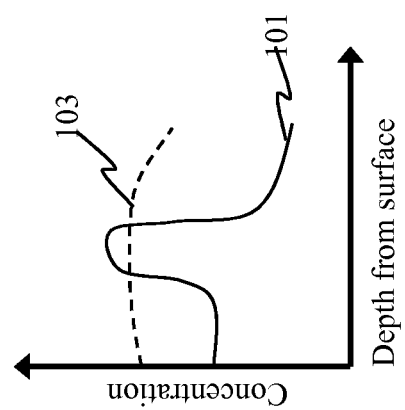
FIG. 1 schematically illustrates a comparison between a super steep retrograde channel/well B depth profile and a broad channel/well doping depth profile.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of variable height between active regions and field oxide after the epitaxial growth and gate height variations attendant upon forming SSRW FETs. In accordance with embodiments of the present disclosure, a controlled deglaze recesses the field oxide to a height of 25 nm above the substrate surface instead of 15 nm by conventional deglazing. As a result, no significant step height is created between the field oxide and epitaxially grown silicon.

Methodology in accordance with embodiments of the present disclosure includes providing a SiN layer on a substrate and forming first, second, and third spaced STI regions of field oxide through the SiN layer and into the substrate. Next, a top portion of the field oxide for each STI region is removed by a controlled deglaze followed by removing the SiN layer. An n-type region is then formed in the substrate between the first and second STI regions and a p-type is formed in the substrate between the second and third STI regions. Last, a Si based layer is epitaxially grown on the substrate over the n-type and the p-type regions.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A through 2D schematically illustrate formation of a SSRW, in accordance with an exemplary embodiment. Adverting to FIG. 2A, a sacrificial oxide layer 201 is formed on a silicon substrate 203 to a thickness of 3 nm. A SiN layer 205 is formed over the sacrificial oxide layer 201 to a thickness of 35 nm. Then, Si substrate 203 is patterned to form active regions (not shown for illustrative convenience) for an NFET 209 and a PFET 211, and STI regions 207 are formed in the substrate, isolating the NFET 209 and the PFET 211. CMP is performed, stopping at the SiN layer 205. The distance 213 (the height of STI region 207 above silicon substrate 203) may be about 35 nm after the CMP.

Figure 2A:
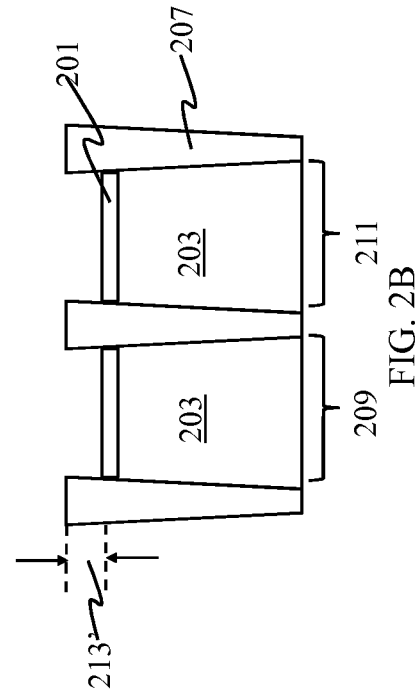
FIGS. 2A through 2D schematically illustrate formation of a SSRW, in accordance with an exemplary embodiment.
Figure 2B:
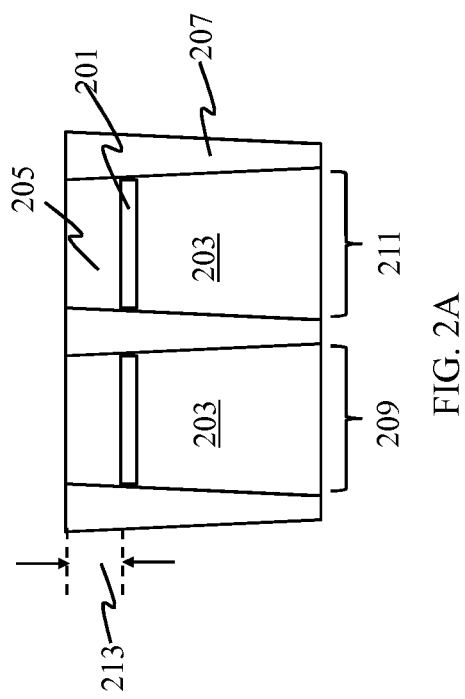

Next, as illustrated in FIG. 2B, a controlled deglaze (dry deglaze or combination of dry and HF process) is performed to reduce the STI region height by 5 nm to 10 nm, leaving about 25 nm above the substrate, and then the SiN layer 205 is removed. The deglazing determines the step height before the gate electrode is formed and needs to be precisely controlled to ensure there is no over growth of epitaxial layers in later steps. The controlled deglazing may be performed using a SiCoNi etch only or a wet/dry/wet etch using HF (for about 20 Å) SiCoNi (for about 40 Å) and HF again (for about 15 Å). SiN layer 205 is then removed, for example by wet etching, e.g. by hot phosphoric acid. The resulting height 213' of the STI region 207 above silicon substrate 203 will be about 25 nm.

Once the SiN layer 205 is removed, a deep well ion implantation is performed for each of NFET 209 and PFET 211, followed by an anneal to drive the ions deep into the substrate to form the deep wells. For instance, B ions may be implanted at a dose of 1E12 to 5E13 per centimeter squared ($cm^2$) with an energy of 36 to 120 keV to form a B channel, or p-type region, and P or As may be implanted at a dose of 8E12 to 3E13 per $cm^2$ with an energy of 100 to 250 keV to form a P or As channel, or n-type region. A further ion implantation may be performed for threshold voltage (Vt) adjustment, for example using boron fluoride ($BF_2$) at a dose of 3E13 to 8E13 with an energy of 10 to 30 keV or B at a dose of 3E13 to 8E13 with an energy of 4 to 10 keV for the NFET and using As, P, or antimony (Sb) ions at a dose of 1 to 4E13 per $cm^2$ with an energy of 6 to 25 keV. An additional ion implantation may be employed for Vtsat centering. Then, the anneal may be a rapid thermal anneal (RTA) at 1000° C. for 5 seconds or a spike RTA at 1000° C.

Figure 2C:
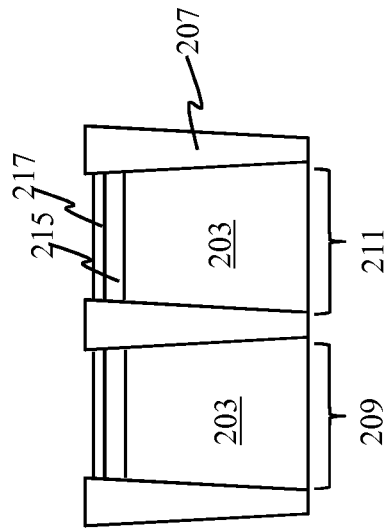

As shown in FIG. 2C, a precleaning is performed to remove sacrificial oxide 201, e.g. by a dry etch. For example, a SiCoNi etch chemistry or a simple dry etch may be employed for the precleaning. During the precleaning step, about 4 nm of field oxide (i.e., the STI oxide) is also removed.

Figure 2D:
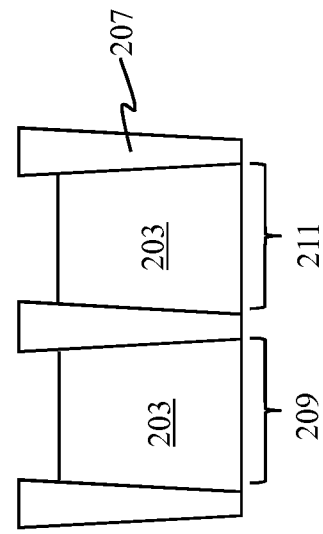

Adverting to FIG. 2D, Si:C is epitaxially grown on the Si to a thickness of 5 nm to 10 nm, with a 0.5 to 2% carbon atomic concentration, on both the NFET 209 and the PFET 211. Then Si is epitaxially grown on the Si:C to a thickness of 10 nm to 15 nm. Because of the increased step height between the STI and the substrate over conventional processes, the epitaxial growth is limited to a substantially vertical growth between STI regions rather than extending laterally over the STI regions, which in results in uniform and well-controlled Si and Si:C thicknesses. Any resulting step height at this point will be adjusted during a dummy gate oxide precleaning in the subsequent replacement metal gate process.

Figure 3A:
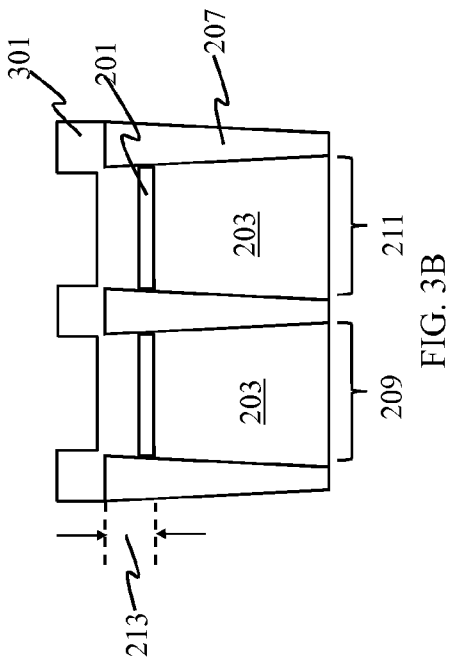
FIGS. 3A through 3I schematically illustrate formation of a SSRW, in accordance with another exemplary embodiment.

FIGS. 3A through 3I schematically illustrate another exemplary embodiment for forming a SSRW. The process begins substantially the same as the first embodiment, with an STI CMP, controlled deglaze and SiN removal, deep well and Vt adjustment ion implantations, and the anneal to drive in the ions, already described above. Accordingly, FIG. 3A is identical to FIG. 2B.

Figure 3B:
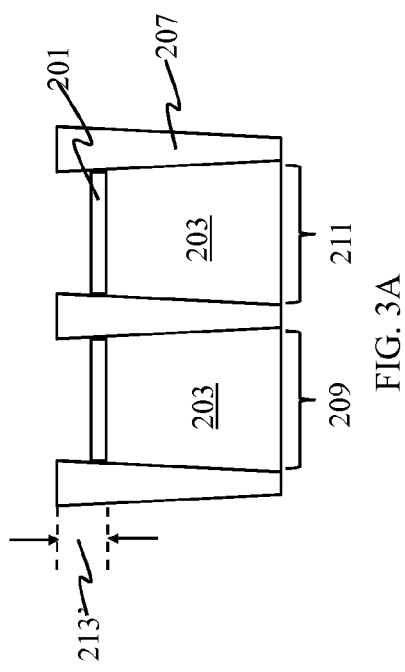
Figure 3C:
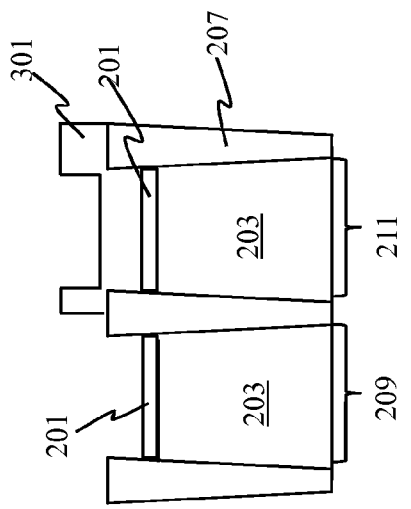

Adverting to FIG. 3B, a SiN hardmask 301 is deposited, for example by blanket deposition, to a thickness of 70 to 100 Å. A photoresist 303 is then lithographically formed over PFET 211, as illustrated in FIG. 3C, to open the B channel area of NFET 209.

Figure 3D:
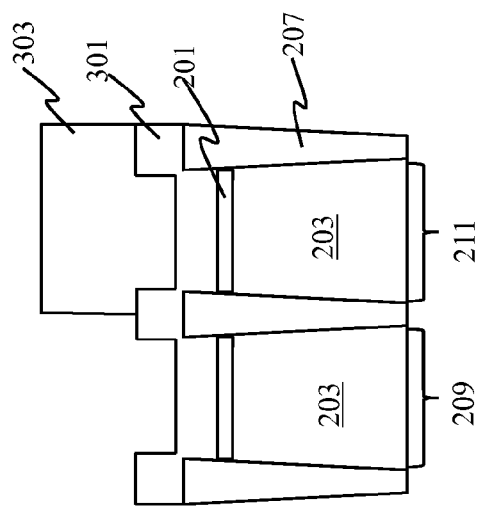
Figure 3E:
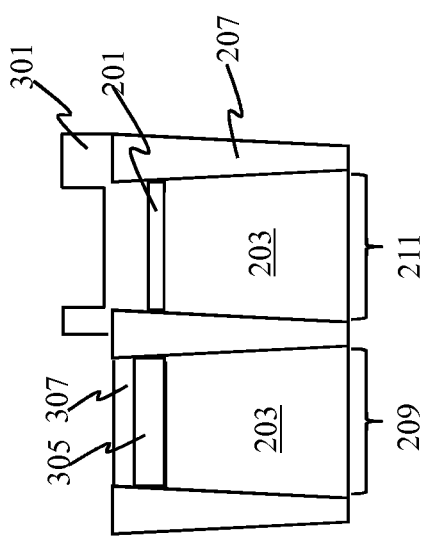

As illustrated in FIG. 3D, hardmask 301 is etched from NFET 209, and photoresist 303 is removed. As shown in FIG. 3E, a precleaning is performed to remove sacrificial oxide 201, e.g. by a dry etch, from NFET 209. For example, a SiCoNi etch chemistry or a simple dry etch may be employed for the precleaning Adverting to FIG. 3E, Si:C 305 is epitaxially grown on the NFET 209 to a thickness of 5 nm to 10 nm, with a 0.5 to 2% carbon atomic concentration, followed by Si 307, which is epitaxially grown on the Si:C to a thickness of 10 nm to 15 nm, for a total epitaxial thickness of 15 to 20 nm. Since PFET 211 is covered by hardmask 301, no epitaxial growth occurs on the P or As channel of PFET 211.

Figure 3F:
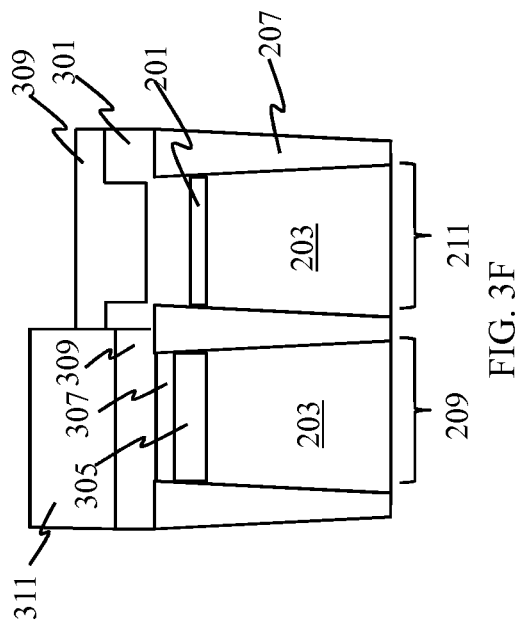

Next, as illustrated in FIG. 3F, a second hardmask 309, for example of SiN, is deposited over both NFET 209 and PFET 211, e.g. by blanket deposition, to a thickness of 70 Å to 100 Å. A photoresist 311 is then lithographically formed over NFET 209, to open the P or As channel area of PFET 211.

Figure 3G:
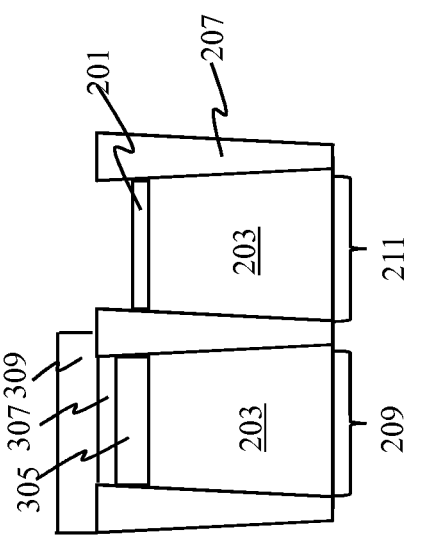
Figure 3H:
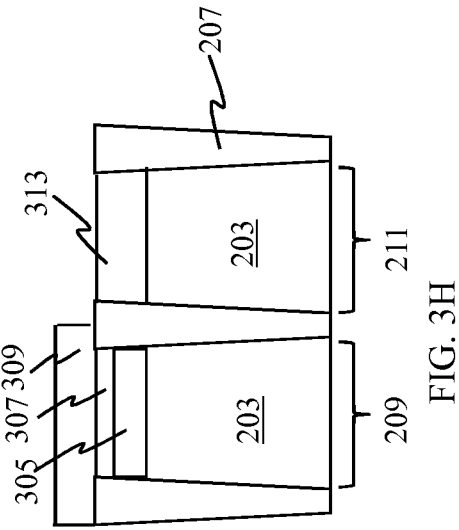
Figure 3I:
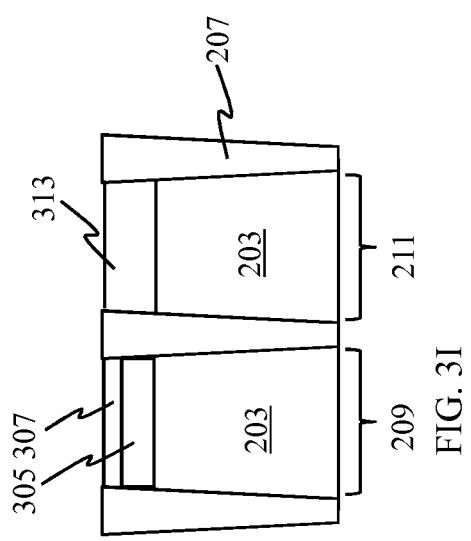

The second hardmask 309 is etched from PFET 211, exposing sacrificial oxide 201, and the photoresist 311 is stripped, as illustrated in FIG. 3G. Another precleaning is performed to remove sacrificial oxide 201, e.g. by a dry etch, from PFET 211. For example, a SiCoNi etch chemistry or a simple dry etch may be employed. Then, Si 313 is epitaxially grown on the PFET 211 to a thickness of 15 to 20 nm, the sum of the thicknesses of Si:C 305 and Si 307, as illustrated in FIG. 3H. Since second hardmask 309 covers NFET 209, no further epitaxial growth occurs on NFET 209. Finally, as illustrated in FIG. 3I, second hardmask 309 is removed from NFET 209, for example by a wet or dry etch. Alternatively, the first hardmask may be removed from the PFET 211 before depositing the second hardmask 309 (not shown for illustrative convenience).

Another alternative (not shown for illustrative convenience) includes processing the PFET first and the NFET second. For example, the first hardmask 301 may be formed over the p-type region of the NFET 209, and Si may be epitaxially grown to a thickness of 15 to 20 nm on the substrate over the n-type region. Next, the second hardmask 309 may be formed over the Si over the n-type region, and the first hardmask and the sacrificial oxide may be removed from the p-type region. Then, a Si:C layer may be epitaxially grown on the substrate in the p-type region to a thickness of 5 to 10 nm, followed by epitaxially growing Si over the Si:C to a thickness of 10 to 15 nm. Last, the second hardmask 309 may be removed.

The embodiments of the present disclosure can achieve several technical effects, controlled step height without Si RIE, uniform and well-controlled epitaxial growth thicknesses, resulting in improved gate height uniformity for replacement metal gates. The present disclosure enjoys industrial applicability in any of various types of highly integrated semiconductor devices for 22 nm technology products and beyond, particularly for 14 nm and 20 nm technology bulk CMOS-based products and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a sacrificial oxide layer on a substrate;
   providing a silicon nitride (SiN) layer above the sacrificial oxide layer;
   forming first, second, and third spaced shallow trench isolation (STI) regions of field oxide through the SiN layer and into the substrate;
   removing a top portion of the field oxide for each STI region by a controlled deglaze;
   removing the SiN layer;
   forming an n-type region in the substrate between the first and second STI regions and a p-type region in the substrate between the second and third STI regions;
   removing the sacrificial oxide layer by precleaning;
   removing 4 nanometers (nm) of field oxide from each STI region during the precleaning; and
   epitaxially growing, after the precleaning, a silicon (Si) based layer on the substrate over the n-type and the p-type regions.

2. The method according to claim 1, further comprising performing chemical mechanical polishing (CMP) on the STI regions down to a top surface of the SiN layer prior to the controlled deglaze.

3. The method according to claim 1, comprising removing 5 to 10 nm of field oxide by the controlled deglaze.

4. The method according to claim 3, wherein the controlled deglaze comprises a SiCoNi etch or a hydrogen fluoride (HF) etch followed by a SiCoNi etch followed by another HF etch.

5. The method according to claim 3, comprising epitaxially growing the Si based layer by:
   epitaxially growing a carbon doped Si (Si:C) layer on the substrate to a thickness of 5 to 10 nm; and
   epitaxially growing a Si layer on the Si:C to a thickness of 10 to 15 nm.

6. The method according to claim 3, comprising epitaxially growing the Si based layer over the p-type region by:
   forming a first hardmask on the sacrificial oxide layer between the first and the second STI regions after forming the n-type and the p-type regions;
   removing the sacrificial oxide layer;
   epitaxially growing the Si:C layer on the substrate over the p-type region; and
   expitaxially growing the Si layer on the Si:C.

7. The method according to claim 6, comprising epitaxially growing the Si layer to a thickness of 10 to 15 nm and epitaxially growing the Si:C layer to a thickness of 5 to 10 nm.

8. The method according to claim 6, comprising epitaxially growing the Si based layer over the n-type region by:
   forming a second hardmask on the Si layer over the p-type region;
   removing the first hardmask from between the first and the second STI regions;
   removing the sacrificial oxide from between the first and the second STI regions;
   epitaxially growing a second Si layer on the substrate over the n-type region; and
   removing the second hardmask.

9. The method according to claim 8, comprising epitaxially growing the second Si layer to a thickness of 20 nm.

10. A method comprising:
    providing a sacrificial oxide and a silicon nitride (SiN) layer on a substrate;
    forming first, second, and third spaced shallow trench isolation (STI) regions of field oxide through the SiN layer, through the sacrificial oxide layer, and into the substrate;
    chemical mechanical polishing (CMP) the STI regions down to a top surface of the SiN layer;
    removing a top 5 to 10 nm of the field oxide for each STI region by a controlled deglaze leaving about 25 nm of field oxide above the substrate for each STI region;
    removing the SiN layer by wet etching;
    forming a phosphorus (P) n-type region in the substrate between the first and second STI regions and a boron (B) p-type in the substrate between the second and third STI regions; and
    epitaxially growing a silicon (Si) based layer on the substrate over the p-type and n-type regions.

11. The method according to claim 10, comprising epitaxially growing a Si:C layer on the substrate over the B p-type region and epitaxially growing a first Si layer on the P n-type region by:
    forming a first hardmask on the sacrificial oxide layer between the second and the third STI regions after forming the p-type and n-type regions;
    removing a portion of the sacrificial oxide layer from the p-type region leaving a remaining sacrificial oxide;
    epitaxially growing the Si:C layer to a thickness of 5 to 10 nm on the substrate over the p-type region;
    epitaxially growing the first Si layer to a thickness of 10 to 15 nm on the Si:C layer;
    forming a second hardmask on the first Si layer;
    removing the first hardmask;
    removing the remaining sacrificial oxide;
    epitaxially growing a second Si layer to a thickness of 20 nm on the substrate over the n-type region; and
    removing the second hardmask.

* * * * *